United States Patent
Wachholz et al.

(10) Patent No.: US 12,358,826 B2
(45) Date of Patent: Jul. 15, 2025

(54) METHOD OF JOINING GLASS ELEMENTS WITH MATERIAL CONTINUITY, GLASS COMPONENT, AND HOUSING, AND VACUUM INSULATING GLASS PANEL COMPRISING THE GLASS COMPONENT

(71) Applicants: Fraunhofer-Gesellschaft zur Förderund der angewandten Forschung e.V., Munich (DE); Technische Universität Berlin, Berlin (DE)

(72) Inventors: Philipp Wachholz, Berlin (DE); Norbert Arndt-Staufenbiel, Berlin (DE); Michael Töpper, Berlin (DE); Julian Schwietering, Berlin (DE)

(73) Assignees: Fraunhofer-Gesellschaft zur Förderund der angewandten Forschung e.V., Munich (DE); Technische Universität Berlin, Berlin (DE)

( * ) Notice: Subject to any disclaimer, the term of this patent is extended or adjusted under 35 U.S.C. 154(b) by 358 days.

(21) Appl. No.: 17/875,578

(22) Filed: Jul. 28, 2022

(65) Prior Publication Data
US 2023/0033251 A1 Feb. 2, 2023

(30) Foreign Application Priority Data
Jul. 28, 2021 (DE) .............. 10 2021 208 160.6

(51) Int. Cl.
*C03B 23/20* (2006.01)
*C03C 21/00* (2006.01)
(Continued)

(52) U.S. Cl.
CPC ............ *C03B 23/20* (2013.01); *C03C 21/005* (2013.01); *C03C 27/02* (2013.01); *F26B 25/14* (2013.01)

(58) Field of Classification Search
CPC ... C03C 27/08; C03C 21/005; C03C 23/0025; C03C 27/02; C03B 23/203; C03B 17/06;
(Continued)

(56) References Cited

U.S. PATENT DOCUMENTS

| | | | |
|---|---|---|---|
| 2017/0050881 A1* | 2/2017 | Abdolvand | ............ B23K 26/53 |
| 2017/0203997 A1* | 7/2017 | Miyake | .................... C03C 3/122 |
| 2018/0186120 A1* | 7/2018 | Dua | ........................ B32B 37/12 |

FOREIGN PATENT DOCUMENTS

| | | | | |
|---|---|---|---|---|
| WO | WO-2016096435 A1 * | 6/2016 | ........... | B23K 26/351 |
| WO | WO-2021090900 A1 * | 5/2021 | | |
| WO | WO-2021108136 A1 * | 6/2021 | ......... | B23K 26/0622 |

OTHER PUBLICATIONS

Nahal et al, Laser-induced dendritic microstructures on the surface of Ag+-doped glass, 2006, J. Appl. Phys. 100, 053503 (Year: 2006).*
(Continued)

*Primary Examiner* — Erin Snelting
*Assistant Examiner* — Steven S Lee
(74) *Attorney, Agent, or Firm* — Faegre Drinker Biddle & Reath LLP

(57) ABSTRACT

A method of joining glass elements with material continuity, to a glass component, to a housing, and to a vacuum insulating panel. The method includes (A) providing first and second glass elements, with each of the glass elements having at least one joining region having an outer edge to be joined, (B) introducing a metallic material into the first glass element in the region of the joining region of the first glass element, (C) placing the first and second glass elements onto one another such that the first and second glass elements
(Continued)

contact one another at least at one outer edge of the respective joining region; and (D) heating the metallic material in the first glass element so that the glass element at least partially melts in the region of the joining region of the first glass element so that a connection with material continuity is produced between the first and second glass elements.

14 Claims, 1 Drawing Sheet

(51) Int. Cl.
    *C03C 27/02*     (2006.01)
    *F26B 25/14*     (2006.01)

(58) Field of Classification Search
    CPC ........ C03B 23/02; B23K 26/20; B23K 26/60; B23K 26/03; F26B 25/01
    See application file for complete search history.

(56) References Cited

OTHER PUBLICATIONS

Aoyama et al, Dendritic growth of silver nanowires in borosilicate glass formed by fieldassisted solid-state ion exchange, 2018, Materials Chemistry and Physics 219 (Year: 2018).*

Awano, T. Silver Dendrite Growth on Silver Ion Conducting Glasses, Science and engineering reports of Tohoku Gakuin University, 2014, vol. 48, No. 1 (Year: 2014).*

* cited by examiner

METHOD OF JOINING GLASS ELEMENTS WITH MATERIAL CONTINUITY, GLASS COMPONENT, AND HOUSING, AND VACUUM INSULATING GLASS PANEL COMPRISING THE GLASS COMPONENT

CROSS-REFERENCE TO RELATED APPLICATION

This application claims priority to Germany Application No. DE 10 2021 208 160.6, filed Jul. 28, 2021, which is herein incorporated by reference in its entirety.

TECHNICAL FIELD

The present invention relates to a method of joining glass elements with material continuity. It further relates to a glass component, and to a housing, and to a vacuum insulating panel comprising a corresponding glass component.

BACKGROUND

Glass components are advantageous with respect to other materials in a number of industrial applications, in particular due to their optical transparency.

It can in particular be important for housings that hermetically sealed inner spaces are present that can protect sensitive components from contamination and external influences.

Two or more glass components have to be joined to produce such a sealed inner space.

Different joining processes are known for this purpose. Conventional melting processes, that is in particular melting processes in which large regions of the glass, or the entire glass, are heated, for example, have the disadvantage, however, that high temperatures can destroy or damage integrated components. Glass solders have to be applied locally and require a large contact area. This has the disadvantage that this technique is only possible for larger components and makes miniaturization more difficult. Metallic soldering techniques require the deposition of a solder that, due to the different coefficients of thermal expansion, can produce great mechanical tensions. Adhesive techniques do not achieve any high demands on hermeticity. Anodic bonding requires both high electrical voltages of typically 800 V and high temperatures of up to 600° C. Such high temperatures and voltages would destroy sensors in a package. When welding by means of CO2, ND:YAG, or diode lasering, the small thermal conductivity of the glass has to be taken into account. On a local heating, they generate high temperature gradients that can result in breakage. In addition, the working distance is very small.

SUMMARY

It is therefore the underlying object of the present invention to propose a method that at least overcomes one or some of the disadvantages mentioned above. It can furthermore be an object of the present invention to propose a glass component, a housing, and/or a vacuum insulating panel that overcomes at least one or some of the disadvantages mentioned above.

At least one of these objects is achieved by a method in accordance with the claims and/or by a glass component, a housing, and/or a vacuum insulating panel in accordance with one of the independent claims.

The method in accordance with the invention in particular serves the joining of glass elements with material continuity. The method comprises the step of providing first and second glass elements, with each of the glass elements having at least one joining region having an outer edge to be joined.

The method preferably furthermore comprises the step of introducing a metallic material into the first glass element in the region of the joining region of the first glass element.

Alternatively, the first glass element can already comprise metallic material in the region of the joining region.

The first and second glass elements are placed onto one another such that the first and second glass elements contact one another at least at one outer edge of the respective joining region to be joined.

The metallic material in the joining region of the first glass element, preferably the introduced metallic material, is heated such that the glass element at least partially melts in the region of the joining region of the first glass element so that a connection with material continuity is produced between the first and second glass elements.

Different modules of glass can thus be connected to one another with material continuity without using auxiliary agents between the glass surfaces placed onto one another.

In an embodiment of the method, the heating of the metallic material can take place by introducing electromagnetic waves and/or by applying a current to the metallic material. The heated metallic material can form metallic structures. The metallic material or the metallic structures can be used to locally absorb electromagnetic waves. This can have the advantage that the glass is only heated locally. This can produce a local melting of the glass of the first and/or second glass elements. The first and second glass elements can thus be locally joined without a component that may be arranged in an inner space between the first and second glass elements likewise being heated or with a component that may be arranged in an inner space between the first and second glass element only being heated to a small degree. Damage caused by heat to components that are arranged in an inner space or close to the joining region of the first and second glass elements can thus be avoided and/or reduced.

In an embodiment, the heating can take place such that the second glass element is heated in the joining region and at least partially melts. Provision can alternatively be made that only the first glass element at least partially melts in the joining region.

The metallic material can, for example, be heated to a temperature of at least 100° C. or at least 300° C. or at least 1000° C. The metallic material can, for example, be heated to a temperature of a maximum of 4000° C. or a maximum of 3000° C. or a maximum of 2000° C.

In an embodiment of the method, electromagnetic waves can be introduced into the first glass element by means of a light source, preferably a laser, or by means of a microwave radiation source. A CW laser or a laser bonder can be used, for example. Further examples for light sources for the introduction of electromagnetic radiation are focused coherent radiation, e.g. lasers for glass soldering processes, non-focused coherent radiation, focused incoherent radiation, non-focused incoherent radiation, e.g. flash lamp annealing.

Alternatively or additionally, the heating of the metallic structures can be carried out by means of microwave radiation or by electrothermal absorption.

The first glass element can thus be welded to the second glass element. The first glass element can be connected to the second glass element in the joining region via a weld seam between the first and second glass elements. An inner space between the first and second glass elements can thus be formed, for example, that is sealed in a gas tight manner, in particular hermetically, with respect to an environment. The inner space can, for example, be a vacuum chamber, in particular a fine vacuum chamber, or a high vacuum chamber, or an ultrahigh vacuum chamber. With a fine vacuum, the pressure in the inner space can be between 1 mbar and 10-3 mbar, for example. With a high vacuum, the pressure in the inner space can be between 10-3 mbar and 10-8 mbar, for example. With an ultrahigh vacuum, the pressure in the inner space can be between 10-8 mbar and 10-11 mbar, for example.

The first and/or second glass elements can comprise metallic material. The metallic material can already be provided in the first and/or second glass elements. Alternatively, the metallic material can be introduced into the first and/or second glass elements.

Ions can, for example, be introduced into the first and/or second glass elements. The ions can, for example, be introduced into the first and/or second glass elements by means of ion exchange and/or ion implantation. Silver ions can, for example, be introduced into the first and/or second glass elements.

In ion implantation, for example, silver ions can be accelerated by an electrical field and can be implanted into glass regions close to the surface. Metallic material can, for example, be introduced into the joining region.

In ion exchange, monovalent alkali ions of the glass elements can be exchanged with other monovalent ions, for example other alkali ions or silver ions. The ion exchange can extend up to far into the glass interior. An ion penetration depth, that is a distance between an outer edge from where the ions are introduced up to a depth that is reached by the penetrating ions, can amount to between 0 and 150 µm, for example. Molten salt can be used as an ion donor for the ion exchange; for example, for the silver-sodium ion exchange, or pastes or a diffusion from solid sources, e.g. sputtered silver, gold, nickel, copper, or platinum.

In an embodiment, the first and/or second glass elements comprises/comprise a glass capable of ion exchange, for example aluminosilicate glasses, borosilicate glasses, thin glasses such as Corning® Gorilla® glass, D 263® T eco, and BOROFLOAT® 33.

In an embodiment, the ions introduced into the first and/or second glass elements can be reduced to metallic material, in particular by applying an electrical field, in particular while supplying heat.

The method step of introducing a metallic material (12) into the first glass element (1) in the region of the joining region (11) of the first glass element (1) can therefore comprise ions being introduced into the first glass element (1) by means of ion exchange and/or ion implantation. The method step of introducing a metallic material (12) into the first glass element (1) in the region of the joining region (11) of the first glass element (1) can moreover comprise ions being reduced to metallic material (12), in particular by applying an electrical field, in particular while supplying heat. The metallic material can be electrochemically deposited at a cathode side of the applied electrical field. A metallic structure, in particular of some few micrometers up to and through the glass, can thus be formed in a controlled manner. The growth start can begin from the glass surface. The metallic material can be a cross-linked 3D structure.

The metallic material introduced—in particular electrochemically deposited—can be electrically conductive. The metallic material can in particular be thermally conductive.

The metallic material can be a cross-linked 3D structure. The metallic material can in particular be present in the form of dendrites. The metallic material can comprise contiguous structures. The contiguous structures can each have a size of at least 50 nm, preferably at least 80 nm, particularly preferably at least 100 nm. The contiguous structures can each have a size of at most 200 µm, preferably at most 150 nm, particularly preferably at most 100 nm.

The method described here can thus in particular differ from methods in which metal ions are present in the glass as nanoparticles and the latter are distributed in the glass. A presence of nanoparticles can, for example, result in an unwanted yellowing of the glass. In addition, nanoparticles typically form an areal layer. Unlike dendrites, nanoparticles typically have a size of 2-50 nm. Nanoparticles are not crosslinked here and are present in 1D. Nanoparticles are not electrically conductive. Nanoparticles are not thermally conductive.

In the present case, the metallic material can, as described above, be present as electrically conductive contiguous structures, for example in the form of dendrites. The introduced metallic material can furthermore be formed in a controlled manner in the glass in the present method such that it is only present in the region of the later joining region. This can have the advantage that a weak focused laser (for example in CW operation or a flood exposure, or an induction) can be used to heat the glass locally, i.e., for example, with an accuracy of less than or equal to 100 µm. This can in particular not be achieved with nanoparticles, for example silver nanoparticles, since nanoparticles do not have sufficiently high an absorption.

An introduction of the metallic material by electrochemical reduction can be advantageous since it does not represent any difference or at least no substantial difference for a process time. It can in particular make no difference or at least no substantial difference for a process time whether, for example, one or 500 metallic structures are produced in a glass element. These structures, i.e. the metallic material, can subsequently be welded at a high process speed and with small tolerances.

In an embodiment, the first and/or second glass elements can be coated for this purpose, for example at two respective surfaces, with a metallic material. The surfaces coated with the metallic material can be electrically contacted. The metal coating can be reduced at the cathode side with the aid of thermal and/or electrical energy.

In an embodiment, the ions introduced int the first and/or second glass elements can be reduced to metallic material (also nanoparticles or clusters) by further reduction mechanisms, for example thermally, chemically, and/or by means of radiation (electromagnetic, ionic, with electrons).

The reduction of ions can convert the metallic material in the first and/or second glass elements into absorption structures. A degree of absorption can be settable via a particle density, for example via a silver particle density. The particle density can be controlled by means of the ion exchange process or the ion implantation process.

In an embodiment, the metallic material can comprise silver, in particular silver atoms.

In an embodiment, the metallic material can have a layer thickness of at least 1 nm, preferably at least 10 nm, particularly preferably at least 100 nm. In addition or alternatively, the metallic material can have a layer thickness of at most 5000 nm, preferably at most 500 nm, particularly preferably at most 100 nm.

The present application further relates to a glass component that comprises a first and second glass element. The first and second glass elements can be joined to one another by an above-described method.

The glass component can be produced by means of a method in accordance with the above description.

The glass component can comprise one or more further glass elements in addition to the first and second glass elements. The glass elements can be joined to one another by means of an above-described method. The first and second glass elements and, if provided, the further glass element or elements can be hermetically connected. The glass elements can in particular be configured and connected such that they form a sealed inner space. The sealed inner space can be a vacuum chamber, particularly preferably an ultrahigh vacuum chamber.

In an embodiment, the first and/or second glass elements has/have at least one further metallic material that forms a metallic structure. The sealed inner space can be electrically contacted to an environment via at least one metallic structure. The metallic material of this metallic structure can be part of the metallic material that serves the heating and welding of the first and second glass elements. It can alternatively also be a separate structure. It can in particular be advantageous for sensors that are arranged in the sealed inner space if they are arranged protected within the sealed inner space, but can be electrically controlled via the metallic structure.

In an embodiment, the glass component can comprise a wafer or a substrate having a cap structure. The glass component can itself be a wafer or a substrate having a cap structure.

The present application further applies to a housing for a sensor, an actuator, a battery, and/or a lens comprising a glass component having some or all of the above-described features.

The present application further relates to a vacuum insulating panel comprising a glass component having some or all of the above-described features.

The method in accordance with the invention can in particular be suitable for bonding cap structures on sensor wafers, actuator wafers, battery wafers, or MEMS wafers, for structured bonding of wafers for image sensor packaging, or for producing lens wafers, for wafer level glass capping and panel level glass capping, or for ultrahigh vacuum chambers for quantum technology.

Advantageous aspects of the invention will be explained by way of example with reference to the following Figures. The features and feature combinations shown are not to be considered as restrictive, but rather only serve the illustration of possible aspects of the invention.

DETAILED DESCRIPTION

Figure 1A:
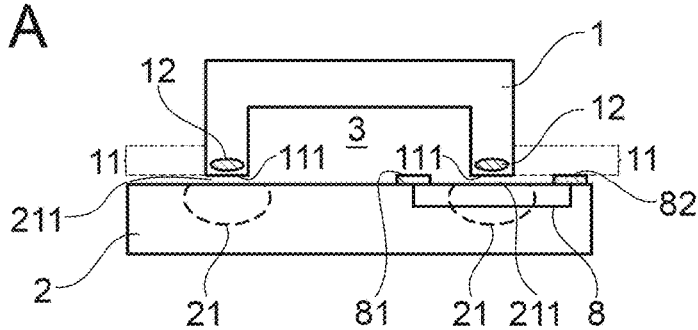
FIG. 1a shows two glass elements in a schematic sectional view.

FIG. 1a shows a first glass element 1 and a second glass element 2 in a schematic sectional representation. The first glass element 1 is preferably in one piece. The second glass element 2 is preferably in one piece. The first glass element 1 has the shape of a hollow parallelepiped without a base. In other embodiments, the first glass element can have a different shape, for example a dome with an angular, elliptical, or circular base surface and can have an arch in the form of a hemisphere or of a bell. Other geometries, in particular parallelepiped, cuboid, or pyramidic designs, can be advantageous depending on the application. It can in particular be advantageous if the first glass element has the shape of a cover or a hood, that is a shape that can be placed onto a surface that is preferably planar and in so doing forms an inner space in which components can be arranged. The first glass element 1 can thus form a housing in conjunction with a second glass element, for example a glass panel such as the glass element 2 shown.

A joining region 11 is provided at a lower edge 111 of the first glass element 1 to be joined. A metallic material 12 is introduced into the glass in this joining region 11. In the present example, the metallic material 12 has a minimal distance from the lower outer edge 111 of 20 nm. In other embodiments, the minimal thickness can, for example, be at least 1 nm, preferably at least 10 nm, particularly preferably at least 100 nm. The minimal distance can, for example, be at most 5000 nm, preferably at most 500 nm, particularly preferably at most 100 nm. The minimal distance can naturally be outside these ranges, in particular when the glass element 1 has larger dimensions.

In the present example, the metallic material 12 has a layer thickness of 20 nm. In other embodiments, the metallic material, for example, can have a layer thickness of at least 1 nm, preferably at least 10 nm, particularly preferably at least 100 nm and/or can have a layer thickness of at most 5000 nm, preferably of at most 500 nm, particularly preferably of at most 100 nm. The layer thickness is preferably constant, but can also vary in the glass element 1.

Figure 1C:
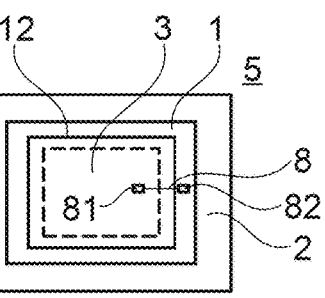
FIG. 1c shows the two glass elements of FIGS. 1a and 1b in a schematic plan view.

The metallic material 12 is introduced in the joining region 11 such that it describes a ribbon shape arranged as a rectangle in a plan view (cf. FIG. 1c).

The first glass element 1 and the second glass element 2 are placed onto one another such that an inner space 3 is formed between the two glass elements 1 and 2. The first glass element 1 in this process contacts the second glass element 2 at the outer edge 111. The second glass element contacts the first glass element at an outer edge 211. The outer edge 211 is disposed in a joining region 21 of the second glass element 2.

Figure 1B:
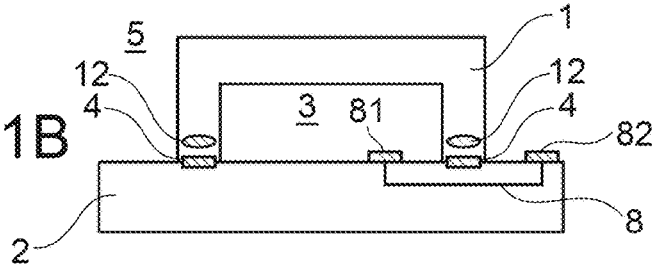
FIG. 1b shows the two glass elements of FIG. 1a in the schematic sectional view in the joined state.

The metallic material 12 in the first glass element 1 is heated so that the first glass element 1 partially melts in the joining region 111. A connection with material continuity is produced between the first glass element 1 and the second glass element 2 in the form of a weld seam 4 such as is shown, for example, in FIG. 1b. The inner space 3 formed between the first glass element 1 and the second glass element 2 is closed in a gastight manner with respect to an environment 5 of the glass elements 1 and 2 and forms a vacuum.

The metallic material 12 was heated by means of electromagnetic waves of a CW laser and in this process the metallic material 12 absorbed the laser radiation, which in turn results in a heating of glass material that surrounds the metallic material 12. The glass material that surrounds the metallic material 12 is here locally heated to a glass transition temperature so that it at least partially melts.

In the present example of FIG. 1, metallic material is only introduced into the first glass element 1. Additionally or alternatively, metallic material can be introduced into the second glass material 2 and can be heated there, for example likewise by means of a laser.

A further metallic material that forms an electrical contact is introduced in the second glass element 2. The contact 8 enables an electrical contacting of the sealed inner space 3. The metallic material that forms the contact 8 can be formed via ion exchange or via ion implantation. An electrical component, for example a sensor that can be connected to a contact 81, can be arranged in the inner space 3. The contact 82 can be connected to a voltage source to supply the electrical component with power.

The first glass element 1 and the second glass element 2 comprise borosilicate glass. The metallic material 12 is introduced into the first glass element 1 by means of ion exchange. The ions are silver ions.

A plan view of the glass elements 1 and 2 in the assembled state is shown in FIG. 1c, with the rectangular parallelepiped form of the first glass element and the plate form of the second glass element being easily visible. The weld seam 4 (not shown) running below the metallic material 12 seals the inner space 3 with respect to the environment 5 in a gastight manner.

Repeating features are provided with the same reference numerals in the Figures.

An exemplary method routine of a glass-glass connection is shown in FIGS. 2a to 2d.

Figure 2A:
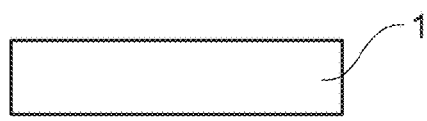
FIG. 2a shows a first glass element in a schematic sectional view.

A detail of a glass element 1 is shown in FIG. 2a. The material and the properties of the glass element shown can correspond to those of the glass element of FIG. 1.

Figure 2B:
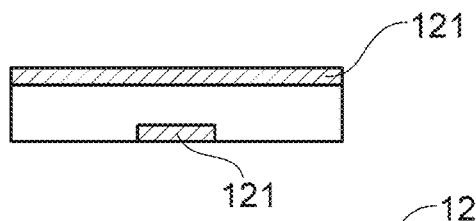
FIG. 2b shows the glass element of FIG. 2a with silver ions in a schematic plan view.

In a next step, that is shown in FIG. 2b, the glass element 1 is prepared in that silver ions 121 are introduced into the glass element 1 by means of ion exchange. Different ions can naturally be introduced additionally or alternatively into the glass element 1 in other embodiments.

Ions from a solid phase, for example in the form of a metal foil or a metal film, can be used, for example. Metallic foils comprising silver and/or copper and/or gold are suitable for this, for example.

Alternatively, ions from a liquid phase, for example from molten salts, can be used. Sodium ions, potassium ions, lithium ions, silver ions, and/or copper ions are suitable for this, for example.

Sol-gels can alternatively be used, for example silver pastes (silver nano ink).

An ion implantation can be provided instead of an ion exchange. Silver ions, sodium ions, potassium ions, magnesium ions, lithium ions, copper ions, and/or gold ions are suitable for this, for example.

Figure 2C:
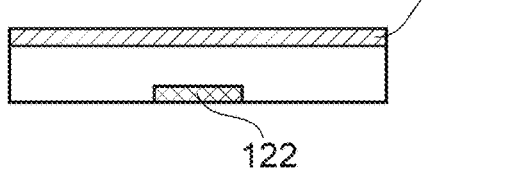
FIG. 2c shows the glass element of FIG. 2b with the silver ions reduced at a cathode side in a schematic sectional view.
Figure 2D:
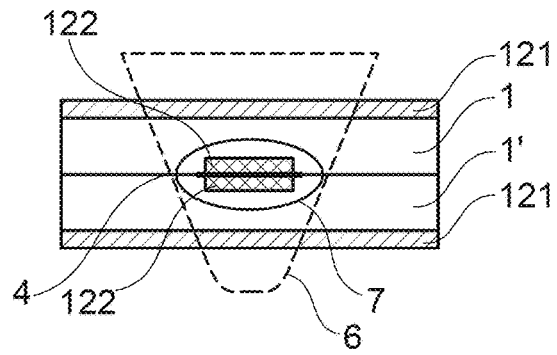
FIG. 2d shows the glass element of FIG. 2c joined with a further glass element in a schematic sectional view.

It is shown in FIG. 2c that the silver ions are reduced to metallic silver 122 at the cathode side. For this purpose, the glass is coated with metal on both sides and an electrical field is applied to the metal surfaces. The silver ions are reduced to metallic silver by thermal and electrical energy. Additionally or alternatively, the silver ions can be reduced thermally, chemically, and/or by means of radiation (electromagnetic, ionic, with electrons).

A further glass element 1' that corresponds to that of FIG. 2c is placed onto the first glass element 1 such that the regions in which the metallic silver is arranged contact one another. Energy 6 is introduced locally by a laser. This produces energy absorption in the region of the metallic silver 122 and a locally heated region 7. In the locally heated region 7, the first glass element 1 and the glass element 1' melt at least partially so that a weld seam 4 is formed and the first glass element 1 and the glass element 1' are joined together with material continuity.

Different modules of glass can thus be connected to one another with material continuity without using auxiliary agents between the glass surfaces. In addition, the high conductivity of the silver structures can be used to be able to electrically contact hermetically closed regions.

The approach proposed for this combines two phenomena here: the local variation of the radiation absorption close to the surface and the welding by means of laser technology. The combinations enables the high local precision of the connection point and the considerable reduction of the radiation intensity. Highly miniaturized structures at low temperatures are therefore made possible. The light power of the laser used here can be sufficiently small that no substantial changes are produced in the glass. The selectivity of the welding process can be restricted by the geometrical accuracy of the silver structures. In addition, a comparatively higher possible working distance can be made possible by the present method that can in particular be important for the joining within a large vacuum chamber.

The following is claimed:

1. A method of joining glass elements with material continuity, the method comprising:
   providing a first glass element and a second glass element, with each of the first glass element and the second glass element having at least one joining region having an outer edge to be joined;
   introducing a metallic material into the first glass element in the at least one joining region of the first glass element, comprising introducing ions into the first glass element by means of at least one of ion exchange or ion implantation, the introduced ions are reduced to the metallic material, and the metallic material is a cross-linked 3D structure;
   placing the first glass element and the second glass element onto one another such that the first glass element and the second glass element contact one another at least at the outer edge of the at least one joining region to be joined; and
   heating the metallic material in the first glass element so that the first glass element at least partially melts in the at least one joining region of the first glass element so that a connection with material continuity is produced between the first glass element and the second glass element.

2. The method of claim 1, wherein the metallic material is at least one of electrically conductive or present in the form of dendrites.

3. The method of claim 1, wherein the introduced metallic material has contiguous structures.

4. The method of claim 3, wherein the contiguous structures each have a size of at least 50 nm.

5. The method of claim 1, wherein the metallic material is electrochemically deposited at a cathode side.

6. The method of claim 1, wherein the heating of the metallic material takes place by at least one of introducing electromagnetic waves or applying a current to the metallic material.

7. The method of claim 6, wherein the electromagnetic waves are introduced into the first glass element by at least one of means of a light source or means of a microwave radiation source.

8. The method of claim 7, wherein the light source comprises a laser.

9. The method of claim 1, wherein the heating takes place such that the second glass element is heated and at least partially melts in the at least one joining region.

10. The method of claim 1, wherein the second glass element comprises metallic material.

11. The method of claim 1, wherein the metallic material comprises silver.

12. The method of claim 1, wherein the metallic material has a layer thickness of at least 1 nm.

13. The method of claim 1, wherein the introduced ions are reduced to metallic material by applying an electrical field.

14. The method of claim 1, wherein the metallic material has a layer thickness of at most 5000 nm.

* * * * *